United States Patent
Ryoo

(10) Patent No.: US 6,922,360 B2
(45) Date of Patent: Jul. 26, 2005

(54) DRAIN PUMP FOR FLASH MEMORY

(75) Inventor: Pil Sang Ryoo, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/739,244

(22) Filed: Dec. 18, 2003

(65) Prior Publication Data

US 2004/0174745 A1 Sep. 9, 2004

(30) Foreign Application Priority Data

Mar. 7, 2003 (KR) .................................. 10-2003-0014254

(51) Int. Cl.[7] .............................................. G11C 16/04
(52) U.S. Cl. ............................. 365/185.18; 365/189.09
(58) Field of Search ....................... 365/185.18, 185.33, 365/189.09, 226

(56) References Cited

U.S. PATENT DOCUMENTS 5,263,000 A * 11/1993 Van Buskirk et al. .. 365/185.33
5,835,420 A * 11/1998 Lee et al. ............... 365/189.09
6,002,354 A * 12/1999 Itoh et al. .................. 341/144

* cited by examiner

*Primary Examiner*—Son Mai
(74) *Attorney, Agent, or Firm*—Marshall, Gerstein & Borun LLP

(57) ABSTRACT

A drain pump for flash memory is disclosed that includes a unit for generating a variable voltage depending on a number of bits to be programmed; a pump to pump an input voltage thereof; and a regulator to regulate an output voltage of the pump depending on the variable voltage.

11 Claims, 4 Drawing Sheets

DRAIN PUMP FOR FLASH MEMORY

BACKGROUND

1. Field of the Invention

The present patent relates to a drain pump for flash memory, and more specifically to a drain pump for flash memory in which an output voltage is varied depending on a number of bits to be programmed.

In a code flash memory, when a stacked gate cell is employed, a voltage of about 9V is supplied to a gate and a voltage of about 5V is supplied to a drain in order to execute a program, whereby hot carriers are generated, and stored in a floating gate.

2. Discussion of Related Art

Generally, when a program is operated in a word mode (for example, X16), all 16 bits may be concurrently programmed. At that time, a current flowing from a drain to a source is significantly larger than that in the case of programming a fewer number of bits. Actually, since electric charges are stored in hot carriers generated by the current, if a process is restrictive, it is not possible to decrease the current in order to reduce time for improving program efficiency and increasing a suitable threshold voltage. When a current per bit is 500 $\mu$A and all bits are programmed in the word mode, a current of 8 mA flows. At that time, a drain pump for generating a voltage of 5V to be supplied to the drain cannot know the number of bits to be currently programmed, the drain pump always supplies a bias voltage to cells with ability of supplying a current of 800 mA or more. Because the number of bits to be programmed is 1 to 16 bits, but a constant voltage is supplied regardless of the number of bits, there is a problem that current dissipation is increased.

SUMMARY OF THE INVENTION

Accordingly, the present patent is directed to provide a drain pump for a flash memory capable of solving the above problems by varying a voltage to be supplied to cells depending on the number of bits.

One aspect of the present patent is to provide a drain pump for a flash memory comprising: a means for generating a variable voltage depending on the number of bits to be programmed; a pump to pump an input voltage; and a regulator to regulate an output voltage of the pump depending on the variable voltage.

Further aspects of the aforementioned drain pump may include a binary digital-to-analog converter that comprise a plurality of current passing means having a pair of transistors which receive a first current and a second current from the OP Amp, respectively, and are turned on depending on an external input data and an inverted external input data, respectively, and of which source terminals are connected to each other; and a plurality of transistors connected between the current passing means and a ground terminal, respectively to be turned on depending on a first reference voltage.

Further aspects of the aforementioned OP Amp may include a first PMOS transistor connected between a power supply and a first node, a first current mirror connected between the first node and a first output terminal to amplify the first current, a second PMOS transistor connected between the power supply and a second node, and a second current mirror connected between the second node and a second output terminal to amplify the second current.

Further aspects of the aforementioned drain pump may include a first resistor connected between the first output terminal and a ground terminal, and a second resistor connected and between the second output terminal and the ground terminal, respectively.

Further aspects of the aforementioned drain pump may include a first mirror includes a third PMOS transistor connected between the first node and the first output terminal, and a fourth PMOS transistor of which a drain terminal and a gate terminal are connected to a drain terminal and a gate terminal of the third PMOS transistor, respectively, and of which the gate terminal is connected to its own source terminal.

Further aspects of the aforementioned first drain pump may include a second current mirror includes a third PMOS transistor connected between the first node and the first output terminal, and a fourth PMOS transistor of which a drain terminal and a gate terminal are connected to a drain terminal and a gate terminal of the third PMOS transistor, respectively, and of which the gate terminal is connected to its own source terminal.

BRIEF DESCRIPTION OF THE DRAWINGS

The aforementioned aspects and other features of the disclosed embodiments will be explained in the following description, taken in conjunction with the accompanying drawings, wherein.

DETAILED DESCRIPTION OF PREFERRED EMBODIMENTS

Now, the disclosed embodiments will be described in detail with reference to the appended drawings.

Figure 1:
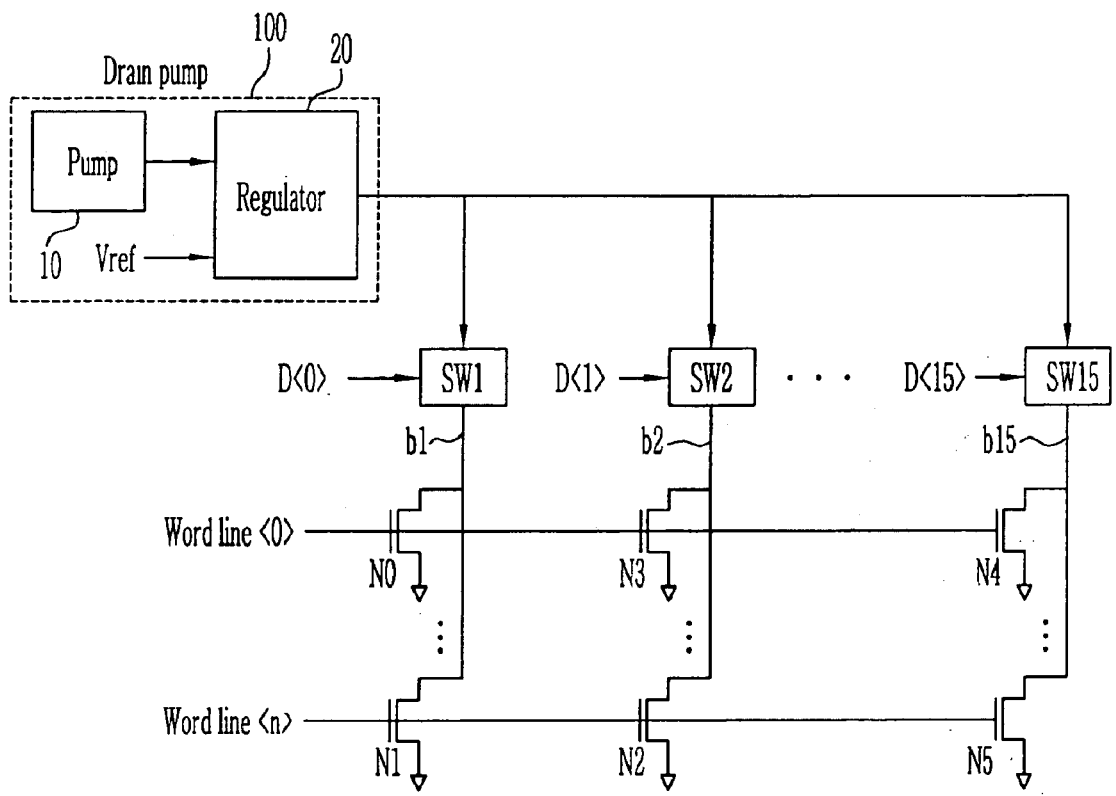
FIG. 1 is a block diagram illustrating an example of a drain pump for flash memory.

FIG. 1 is a block diagram illustrating an example of a drain pump for flash memory.

The conventional drain pump 100 includes a pump 10 for pumping an input voltage to a predetermined level, and a regulator 20 for regulating the pumped voltage to a predetermined voltage level depending on a reference voltage Vref. An output of the regulator 20 is supplied to bit lines b1 to b15 connected to cells through switches SW1 to SW15. Memory cells N0 ... N5 to be selected by word lines Word line<0> to Word line<n>, are connected to the respective bit lines. The switches SW1 to SW15 are turned-on depending on external input data D<0> to D<15>. In other words, when the external input data D<0> to D<15> are program data, the switches are turned-on to supply a program voltage from the regulator 20 to the bit lines b1 to b15, thereby programming the relevant cells. For example, when the word line Word line<0> is selected and the external input data D<0> is a program data, the memory cell N0 is programmed.

Figure 2:
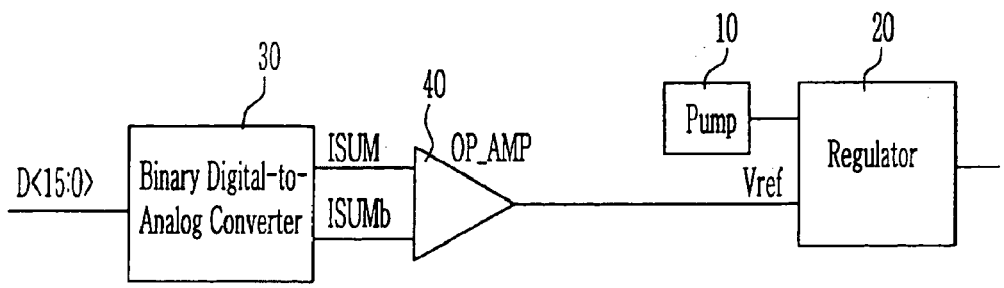
FIG. 2 is a block diagram illustrating an embodiment of an exemplary drain pump.

FIG. 2 is a block diagram illustrating an embodiment of an exemplary drain pump for flash memory.

The drain pump 10 comprises a binary digital-to-analog converter 30, an OP Amp 40, a pump 10, and a regulator 20.

The binary digital-to-analog converter 30 varies quantities of first and the second currents ISUM, ISUMb, depending on the external input data D<0> to D<15>. The first and the second currents ISUM, ISUMb are amplified in an OP Amp 40, and the amplified voltage becomes a reference voltage Vref that is supplied to the regulator 20. The pump 10 pumps the input voltage to a predetermined level, and the regulator 20 regulates the output of the pump 10 depending on the reference voltage Vref.

Figure 3:
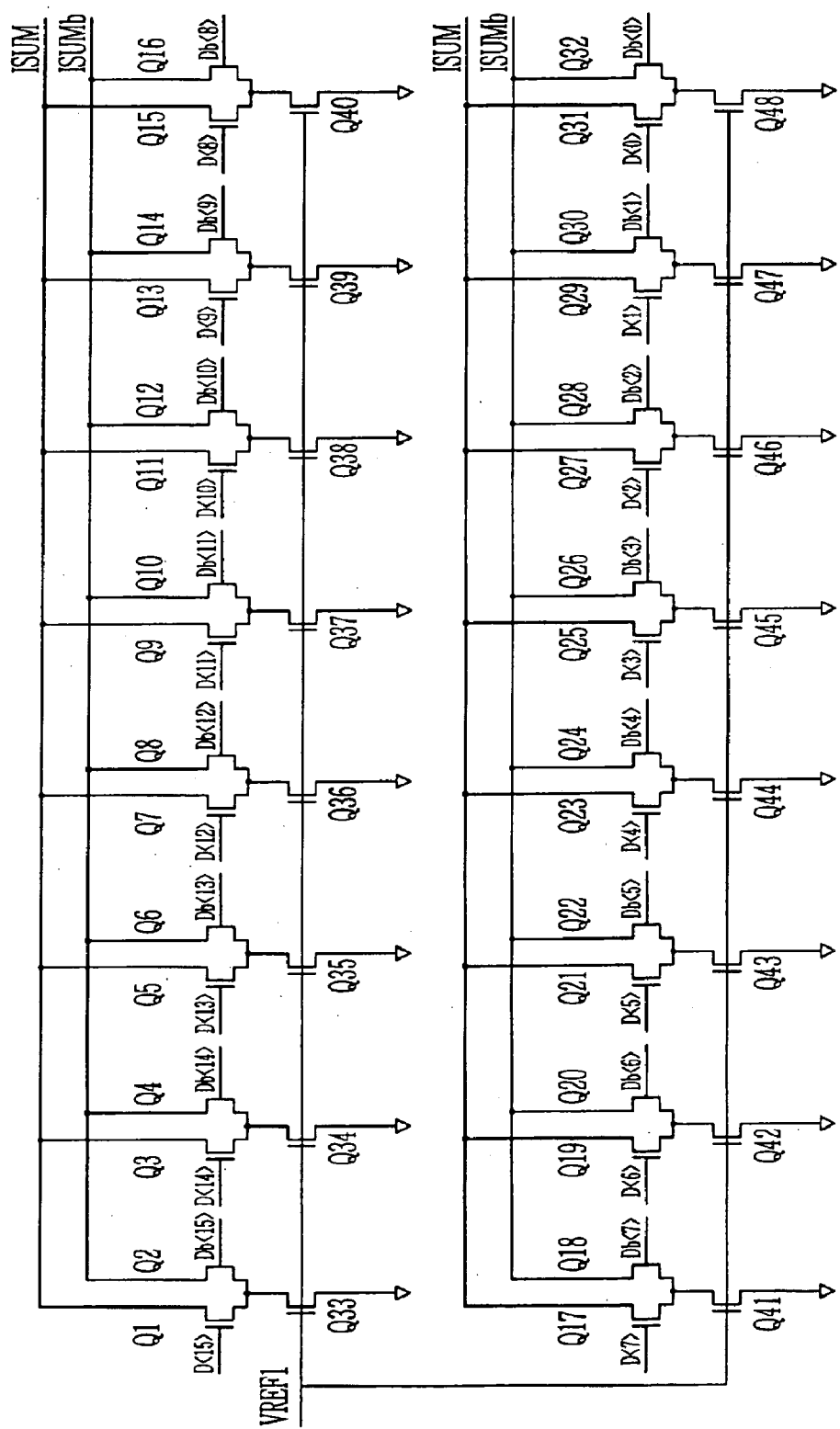
FIG. 3 is a detailed circuit diagram illustrating a binary digital-to-analog converter of FIG. 2.

FIG. 3 is a detailed circuit diagram of a binary digital-to-analog converter of FIG. 2.

NMOS transistors Q33 to Q48 keep their own states on the basis of a reference voltage VREF1. For example, when the external input data D<8> is a program data, D<8> is high while Db<8> is low, whereby the NMOS transistor Q15 is turned-on, while the NMOS transistor Q16 is turned-off. In addition, since the other external input data D<0> to D<7> and D<9> to D<15> are low, the NMOS transistors Q1, Q3, Q5, Q7, Q9, Q11, Q13, Q17, Q19, Q21, Q23, Q25, Q27, Q29, Q31 are turned-off, while the inverted external input data Db<0> to Db<7>, Db<9> to Db<15> are high states, the NMOS transistors Q2, Q4, Q6, Q8, Q10, Q12, Q14, Q18, Q20, Q22, Q24, Q26, Q28, Q30, Q32 are turned-on. Therefore, the first current ISUM is small, while the second current ISUMb is large.

For example, when the external input data D<0> to D<14> are program data, the NMOS transistors Q3, Q5, Q7, Q9, Q11, Q13, Q15, Q17, Q19, Q21, Q23, Q25, Q27, Q29, Q31 are turned-on, while the NMOS transistors Q2, Q4, Q6, Q8, Q10, Q12, Q14, Q16, Q18, Q20, Q22, Q24, Q26, Q28, Q30, Q32 are turned-off. Therefore, the first current ISUM becomes larger than the second current ISUMb.

As a result, the currents ISUM, ISUMb are varied depending on the external input data. In other words, the currents can be increased or decreased depending on the external input data, that is, the number of bits to be programmed. When the number of bits to be programmed is large, the currents are increased, and when the number of bits to be programmed is small, the currents are decreased.

Figure 4:
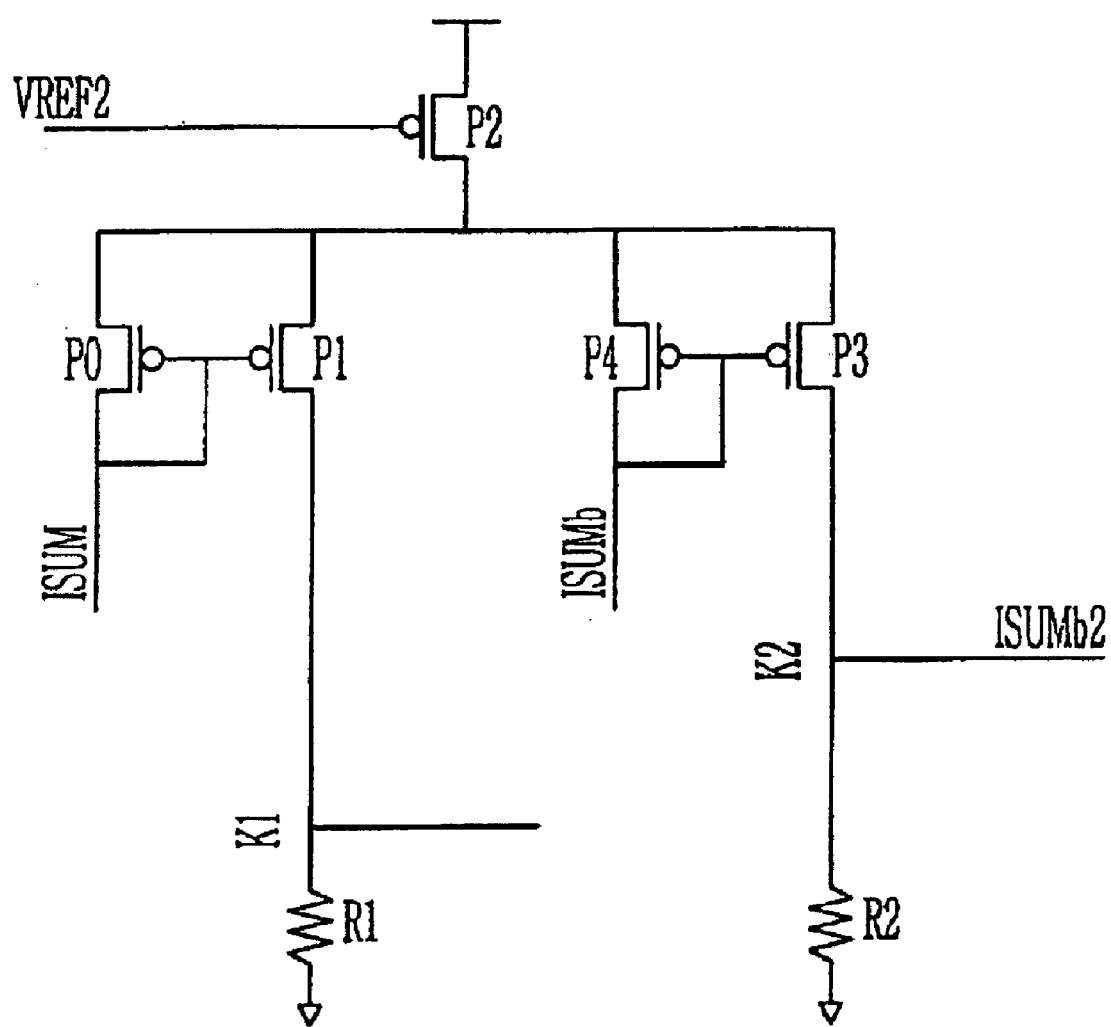
FIG. 4 is a detailed circuit diagram of an OP Amp of FIG. 2.

FIG. 4 is a detailed circuit diagram of an OP Amp of FIG. 2.

Referring to FIG. 4, a PMOS transistor P2 is controlled depending on a reference voltage VREF2. PMOS transistors P0 and P1 are constructed to form a current mirror, wherein a channel width and a channel length of the PMOS transistor P2 are double those of the PMOS transistor P1. In other words, the first current ISUM is doubled through a resistor R1.

Furthermore, PMOS transistors P3 and P4 are constructed to form a current mirror, wherein a channel width and a channel length of the PMOS transistor P3 are double those of the PMOS transistor P4. In other words, the second current ISUM is doubled through a resistor R2.

A voltage at a connection point K1 of the resistor R1 and the PMOS transistor P1, or a voltage at a connection point K2 of the resistor R2 and the PMOS transistor P3, is used as the reference voltage Vref of the regulator 20 of FIG. 2. Because the generated reference voltage Vref is varied depending on the number of bits to be programmed, the output voltage of the regulator 20 is varied depending on the number of bits to be programmed. In other words, by controlling an output voltage of the OP Amp, for example, into 16 levels, when the number of bits to be programmed is increased, the output voltage of the regulator is controlled to be increased, whereby a program current is increased to maintain program efficiency. On the contrary, when the number of bits to be programmed is decreased, the output voltage of the regulator is controlled to be decreased, whereby a program current is decreased to maintain program efficiency. According to the disclosed embodiments, it is possible to improve the program efficiency and to prevent a voltage between a drain and a source of a memory cell from exceeding a break down voltage, in other words, to minimize variation of electrical characteristic.

Figure 5:
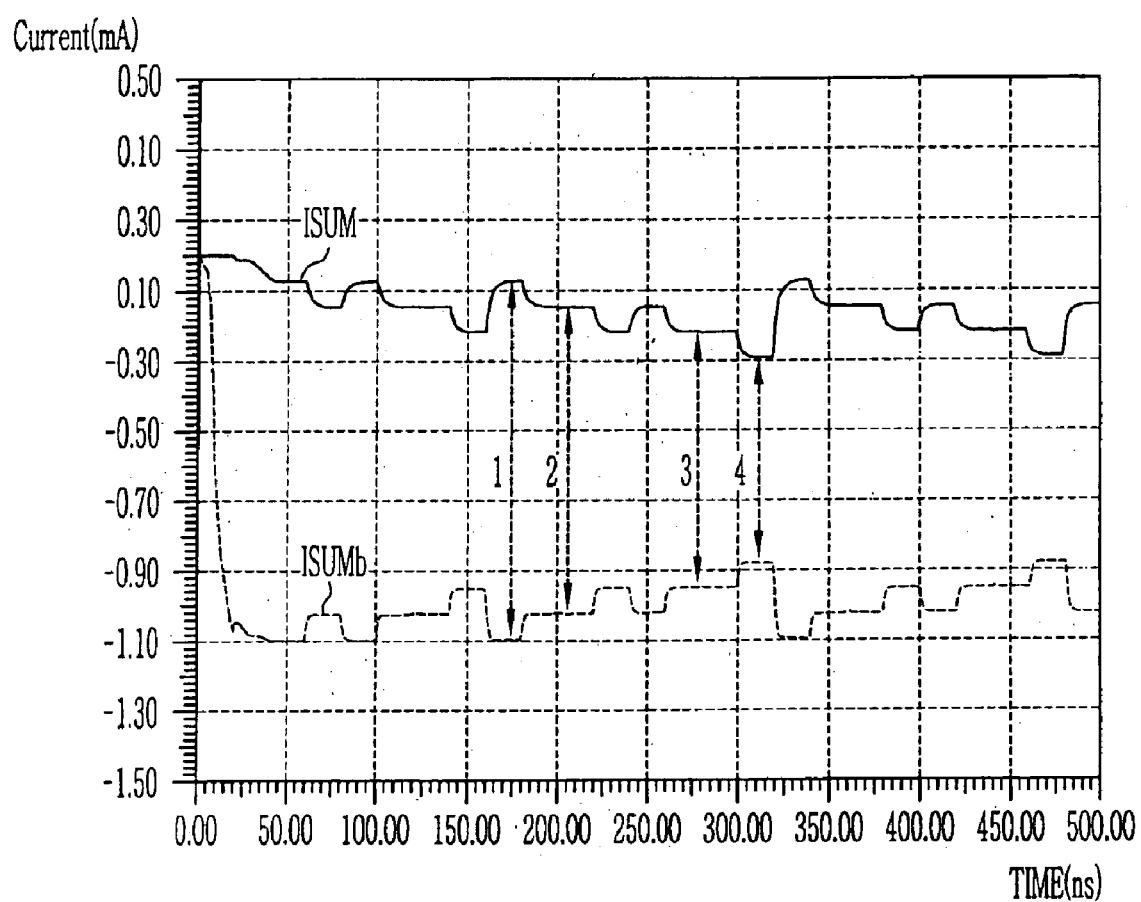
FIG. 5 is a waveform diagram illustrating a result of simulating the binary digital-to-analog converter of FIG. 3.

FIG. 5 is a waveform diagram illustrating a result of simulating the binary digital-to-analog converter according to the disclosed embodiments.

As shown in FIG. 5, the first and second currents ISUM and ISUMb are varied depending on the number of bits to be programmed.

As described above, according to the disclosed embodiments, it is possible to solve a problem of over-programming caused by excessive drain voltage by controlling a level of a drain pump depending on the number of bits to be programmed, and to improve a process margin by ensuring a margin of a break-down voltage between a drain and a source of a memory cell. In addition, it is possible to improve reliability of the memory cell by repeated program operation.

In the above description, although the present invention has been described in detail using the specific embodiments, the present invention is not limited to the embodiments, but improvements and modifications can be made by those skilled in the art without departing from the spirit of the present invention, and the scope of the present invention is limited by claims as follows.

What is claimed is:

1. A drain pump for a flash memory comprising:
   a means for generating a variable voltage depending on a number of bits to be programmed;
   a pump to pump an input voltage; and
   a regulator to regulate an output voltage of the pump depending on the variable voltage.

2. A drain pump for a flash memory according to claim 1, wherein the mean comprises a binary digital-to-analog converter to generate a varying current depending on the number of bits to be programmed and an OP Amp to amplify the output voltage of the binary digital-to-analog converter to generate the variable voltage.

3. A drain pump for a flash memory according to claim 2, wherein the binary digital-to-analog converter comprises a plurality of current passing means having a pair of transistors which allow a first current and a second current to flow, respectively, and are turned on depending on an external input data and an inverted external input data, respectively, and of which source terminals are connected to each other; and a plurality of transistors connected between the current passing means and a ground terminal, respectively to be turned on depending on a first reference voltage.

4. A drain pump for a flash memory according to claim 3, wherein the OP Amp comprises a first PMOS transistor connected between a power supply and a first node, a first current mirror connected between the first node and a first output terminal to amplify the first current, and a second current mirror connected between a second node and a second output terminal to amplify the second current.

5. A drain pump for a flash memory according to claim 4, further comprising a first resistor connected between the first output terminal and a ground terminal, and a second resistor connected between the second output terminal and the ground terminal.

6. A drain pump for flash memory according to claim 4, wherein the first current mirror comprises a third PMOS transistor connected between the first node and the first output terminal, and a fourth PMOS transistor of which a drain terminal and a gate terminal are connected to a drain terminal and a gate terminal of the third PMOS transistor, respectively, and of which the gate terminal is connected to its own source terminal.

7. A drain pump for a flash memory according to claim 4, wherein the second current mirror comprises a third PMOS transistor connected between the first node and the second output terminal, and a fourth PMOS transistor of which a drain terminal and a gate terminal are connected to a drain terminal and a gate terminal of the third PMOS transistor, respectively, and of which the gate terminal is connected to its own source terminal.

8. A drain pump for a flash memory according to claim 2, wherein the OP Amp comprises a first PMOS transistor connected between a power supply and a first node, a first current mirror connected between the first node and a first output terminal to amplify a first current, and a second current mirror connected between a second node and a second output terminal to amplify a second current.

9. A drain pump for a flash memory according to claim 8, further comprising a first resistor connected between the first output terminal and a ground terminal, and a second resistor connected between the second output terminal and the ground terminal.

10. A drain pump for a flash memory according to claim 8, wherein the first current mirror comprises a third PMOS transistor connected between the first node and the first output terminal, and a fourth PMOS transistor of which a drain terminal and a gate terminal are connected to a drain terminal and a gate terminal of the third PMOS transistor, respectively, and of which the gate terminal is connected to its own source terminal.

11. A drain pump for a flash memory according to claim 8, wherein the second current mirror comprises a third PMOS transistor connected between the first node and the second output terminal, and a fourth PMOS transistor of which a drain terminal and a gate terminal are connected to a drain terminal and a gate terminal of the third PMOS transistor, respectively, and of which the gate terminal is connected to its own source terminal.

* * * * *